United States Patent
Berzins et al.

(10) Patent No.: US 10,581,410 B2
(45) Date of Patent: Mar. 3, 2020

(54) HIGH SPEED DOMINO-BASED FLIP FLOP

(71) Applicants: Matthew Berzins, Cedar Park, TX (US); James Jung Lim, Austin, TX (US)

(72) Inventors: Matthew Berzins, Cedar Park, TX (US); James Jung Lim, Austin, TX (US)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/018,454

(22) Filed: Feb. 8, 2016

(65) Prior Publication Data

US 2017/0077908 A1 Mar. 16, 2017

Related U.S. Application Data

(60) Provisional application No. 62/216,867, filed on Sep. 10, 2015, provisional application No. 62/237,784, filed on Oct. 6, 2015.

(51) Int. Cl.
 *H03K 3/012* (2006.01)
 *H03K 3/356* (2006.01)

(52) U.S. Cl.
 CPC ....... *H03K 3/012* (2013.01); *H03K 3/356113* (2013.01)

(58) Field of Classification Search
 CPC ............... H03K 19/0013; H03K 3/012; H03K 3/356156; H03K 3/3562; H03K 3/35625
 USPC .......................................................... 327/211
 See application file for complete search history.

(56) References Cited

U.S. PATENT DOCUMENTS

| | | | |
|---|---|---|---|
| 4,527,075 A | 7/1985 | Zbinden | |
| 5,189,319 A | 2/1993 | Fung et al. | |
| 5,410,263 A | 4/1995 | Waizman | |
| 5,764,089 A * | 6/1998 | Partovi | H03K 3/037 327/200 |
| 6,108,805 A | 8/2000 | Rajsuman | |
| 6,181,180 B1 * | 1/2001 | Chen | H03K 3/012 327/211 |
| 6,316,960 B2 * | 11/2001 | Ye | H03K 19/096 326/95 |
| 6,456,133 B1 | 9/2002 | Nair et al. | |
| 6,496,038 B1 | 12/2002 | Sprague et al. | |
| 6,654,893 B1 * | 11/2003 | Samala | H03K 3/356139 713/300 |

(Continued)

OTHER PUBLICATIONS

Ng et al., Energy-recovery flip-flop design using improved adiabatic pseudo-domino logic structure, Microelectronics Journal 30, 1999, 851-854.*

(Continued)

*Primary Examiner* — Patrick C Chen
(74) *Attorney, Agent, or Firm* — The Farrell Law Firm, P.C.

(57) ABSTRACT

Apparatuses for a flip-flop are provided. One apparatus for a flip-flop includes a domino logic flip-flop, including a single footer transistor for all nodes in the domino logic flip-flop to be pre-charged, wherein the single footer includes a footer node; and a pre-charge transistor connected to the footer node for pre-charging the footer node before an evaluation cycle. Another apparatus for a flip-flop includes a domino logic flip-flop; and combinatory logic configured to evaluate a complimentary signal in conjunction with circuit events.

20 Claims, 2 Drawing Sheets

(56) References Cited

U.S. PATENT DOCUMENTS

| | | | |
|---|---|---|---|
| 6,771,136 B1 | 8/2004 | Reynolds | |
| 7,064,584 B2* | 6/2006 | Bertram | H03K 19/0963 326/121 |
| 7,109,776 B2 | 9/2006 | Tschanz et al. | |
| 7,173,456 B2* | 2/2007 | Lundberg | H03K 19/0963 326/95 |
| 7,487,417 B2 | 2/2009 | Branch et al. | |
| 7,541,832 B1 | 6/2009 | Clark et al. | |
| 7,570,094 B2 | 8/2009 | Mnich | |
| 7,596,732 B2 | 9/2009 | Branch et al. | |
| 7,622,955 B2 | 11/2009 | Vilangudipitchai et al. | |
| 7,639,057 B1 | 12/2009 | Su | |
| 7,671,651 B2 | 3/2010 | Kim | |
| 7,772,889 B2 | 8/2010 | Naffziger | |
| 7,868,677 B2* | 1/2011 | Jain | H03K 3/012 327/202 |
| 7,902,878 B2 | 3/2011 | Saint-Laurent et al. | |
| 8,004,331 B2 | 8/2011 | Li et al. | |
| 8,030,982 B2 | 10/2011 | Datta et al. | |
| 8,058,905 B1 | 11/2011 | Klein et al. | |
| 8,384,457 B2 | 2/2013 | Ozgun et al. | |
| 9,000,804 B2 | 4/2015 | Priel et al. | |
| 9,018,995 B2 | 4/2015 | Subramani et al. | |
| 2002/0175726 A1* | 11/2002 | Vangal | H03K 3/0372 327/202 |
| 2004/0257115 A1* | 12/2004 | Bertram | H03K 3/012 326/98 |
| 2007/0229124 A1* | 10/2007 | Tokuno | H03K 5/1534 327/112 |
| 2013/0088273 A1* | 4/2013 | Sathianthan | H03K 3/35625 327/200 |
| 2014/0075233 A1 | 3/2014 | Bating et al. | |
| 2014/0184271 A1 | 7/2014 | Gurumurthy et al. | |
| 2014/0189453 A1 | 7/2014 | Gurumurthy | |
| 2015/0070063 A1 | 3/2015 | Gurumurthy et al. | |
| 2015/0145577 A1 | 5/2015 | Berzins et al. | |

OTHER PUBLICATIONS

John (Flip-flop conversion, http://www.circuitstoday.com/flip-flop-conversion, Mar. 7, 2012).*

R. Bhutada et al., Complex clock gating with integrated clock gating logic cell, Design & Technology of Int. Syst., 2007. pp. 164-169 DOI:10.1109/DTIS.2007.4449512.

J. A. Galvis, Low-power flip-flop using internal clock gating and adaptive body bias, University of South Florida Scholar Commons, Graduate Theses and Dissertations, Ph.D. Dissertation, University of South Florida, 2006, pp. 1-161 http://scholarcommons.usf.edu/cgi/viewcontent.cgi?article=3527&context=etd.

S. Wimer et al., The optimal fan-out of clock network for power minimization by adaptive gating, IEEE Transactions on Very Large Scale Integration (VLSI) Systems 2011, pp. 1772-1780, VLSI Systems, IEEE Trans. on, vol. 20, No. 10, DOI:10.1109/TVLSI.2011.2162861.

I. Varun et al., Ultra-low power nand based multiplexer and flip-flop, 2013 Nirma University International Conference on Engineering (NUICONE) NUiCONE, 2013 Int. Conf., pp. 1-5 DOI:10.1109/NUiCONE.2013.6780110.

Sung-Mo Kang et al., "CMOS Digital Integrated Circuits Analysis and Design", Third Edition, 2005, pp. 388, 389, 391 (684 total pages).

Taiwanese Office Action dated Aug. 29, 2019 issued in counterpart application No. 10820828060, 7 pages.

* cited by examiner

HIGH SPEED DOMINO-BASED FLIP FLOP

PRIORITY

This application claims priority under 35 U.S.C. § 119(e) to a U.S. Provisional patent application filed on Sep. 10, 2015 in the United States Patent and Trademark Office and assigned Ser. No. 62/216,867, and to a U.S. Provisional patent application filed on Oct. 6, 2015 in the United States Patent and Trademark Office and assigned Ser. No. 62/237,784, the entire contents of both of which are incorporated herein by reference.

BACKGROUND OF THE DISCLOSURE

Field of the Disclosure

The present disclosure relates generally to a flip-flop, and more particularly, to a high-speed domino-based flip-flop.

Description of the Related Art

A high speed flip-flop with minimized area and reduced power is desirable in many applications such as a mobile terminal.

The difference between a time at which a clock signal (CK) of a flip-flop controls an output (e.g. Q) of the flip-flop to transition to a predetermined output logic level and a time ($t_{ckq}$) at which the output of the flip-flop actually transitions to the predetermined logic level, which is commonly referred to as a CK to Q delay, is a factor that determines the maximum operating frequency (e.g. the minimum time period of a clock cycle ($T_{ck}$)) of the flip-flop. Setup time ($t_{setup}$) (i.e., a time for which inputs to a flip-flop must be present and stable before a clock signal commands an output of the flip-flop to transition to a predetermined logic level) is also a factor in determining the maximum operating frequency of a flip-flop. A propagation delay ($t_{pd}$) for any combinatorial logic that is used with a flip-flop is also a factor in determining the maximum frequency of operation of a flip-flop. The sum of these three factors determines the minimum clock cycle of a flip-flop, as indicated in Equation (1) as follows:

$$T_{ck} \geq t_{ckq} + t_{pd} + t_{setup} \quad (1)$$

Absent clock skew, only $t_{ckq}$ and $t_{setup}$ are a function of the design of a flip-flop. Thus, reducing $t_{ckq}$ and $t_{setup}$ of a flip-flop will increase its operating frequency (i.e., reduce its $T_{ck}$).

A conventional domino-based set-reset (SR) flip-flop, which includes a master latch and a slave latch, uses a clock signal (CK) of the flip-flop to pre-charge and evaluate the logic level of the master latch. That is, a conventional domino-based flip-flop pre-charges nodes of the master latch and the slave latch when CK is low and evaluates them when CK is high. The conventional domino-based flip-flop also includes footers, which are used to discharge a pre-charged node during the evaluation cycle, if the inputs indicate that the nodes should be low. If the inputs indicate that a pre-charged node should remain high then the node is not discharged during the evaluation cycle.

The setup time of a domino-based SR flip-flop is reduced as compared to an SR flip-flop that does not use domino logic (e.g. an SR flip-flop that uses all static logic). However, a domino-based SR flip-flop executes a pre-charge cycle and an evaluation cycle during each clock cycle whether or not the nodes in the SR flip-flop being evaluated are required to change due to the values of the inputs to the SR flip-flop. Thus, a domino-based flip-flop consumes power when it is not necessary to do so.

An SR flip-flop uses a complimentary data signal ($\overline{data}$) to re-set the SR flip-flop, which requires an evaluation of the complimentary data signal. It takes time to generate a compliment of a signal (e.g. a propagation time of an inverter to generate a compliment of a signal input to the inverter). In addition, power is consumed in generating and evaluating the complimentary signal. The consequence of which is a longer evaluation time, which increases the CK to Q delay, and higher power consumption.

Thus, there is a need for a flip-flop that has a lower CK to Q delay, a lower setup time, and consumes less power.

SUMMARY

An apparatus for a flip-flop is provided. The apparatus for a flip-flop includes a domino logic flip-flop, including a single footer transistor for all nodes in the domino logic flip-flop to be pre-charged, wherein the single footer includes a footer node; and a pre-charge transistor connected to the footer node for pre-charging the footer node before an evaluation cycle.

An apparatus for a flip-flop. The apparatus for a flip-flop includes a domino logic flip-flop; and combinatory logic configured to evaluate a complimentary signal in conjunction with circuit events.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION OF EMBODIMENTS OF THE PRESENT DISCLOSURE

Figure 1:
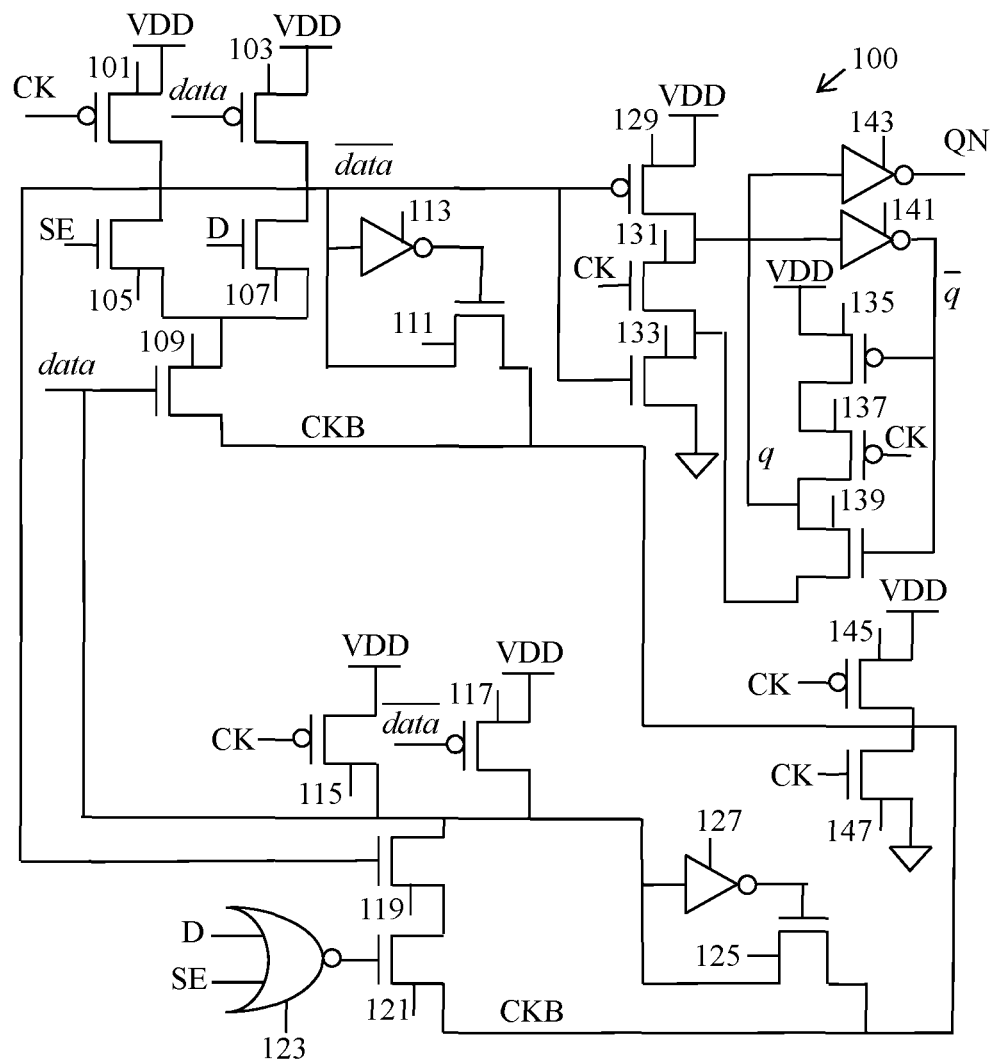
FIG. 1 is a schematic diagram of a flip-flop according to an embodiment of the present disclosure.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist the overall understanding of the embodiments of the present disclosure. Therefore, it should be apparent to those skilled in the art that various changes and modifications of the embodiments described herein may be made without departing from the scope and spirit of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout the specification.

The present disclosure may have various modifications and various embodiments, among which embodiments are described below in detail with reference to the accompanying drawings. However, it should be understood that the present disclosure is not limited to these embodiments, but includes all modifications, equivalents, and alternatives within the spirit and the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of addition of one or more other features, numerals, steps, operations, structural elements, parts, or combinations thereof.

Unless defined differently, all terms used herein have the same meanings as those understood by a person skilled in the art to which the present disclosure belongs. Such terms as those defined in a generally used dictionary are to be interpreted to have the same meanings as the contextual meanings in the relevant field of art, and are not to be interpreted to have ideal or excessively formal meanings unless clearly defined in the present disclosure.

An aspect of the present disclosure provides an apparatus for a flip-flop that reduces setup time.

Another aspect of the present disclosure provides an apparatus for a flip-flop that slows down the evaluation process to reduce setup time.

Another aspect of the present disclosure provides an apparatus for a flip-flop that reduces CK to Q delay.

Another aspect of the present disclosure provides an apparatus for a flip-flop including one footer transistor for evaluating all pre-charged nodes.

Another aspect of the present disclosure provides an apparatus for a flip-flop that pre-charges the drain of the footer transistor.

Another aspect of the present disclosure provides an apparatus for a flip-flop that reduces the capacitive load on CK.

Another aspect of the present disclosure provides an apparatus for a flip-flop with fewer transistors and a smaller integrated circuit area than a conventional domino-based SR flip-flop.

Another aspect of the present disclosure provides an apparatus for a flip-flop with less CK to Q delay and higher speed than conventional high speed flip-flop.

Another aspect of the present disclosure provides an apparatus for a flip-flop with less power than a conventional pulsed domino SR flip-flop.

Another aspect of the present disclosure provides an apparatus for a flip-flop that evaluates a complimentary signal in conjunction with other circuit events to increase speed and reduce power consumption.

A domino-based RS flip-flop pre-charges two latch nodes and pulls down one of the latch nodes when CK goes high, based on the values of the inputs. After CK goes high, the whole latch is in a temporary floating state for a brief period of time before the latch nodes are evaluated. In an embodiment of the present disclosure, the period of the temporary floating state (e.g. the setup window) is extended by using only one footer transistor and pre-charging a terminal of the footer transistor (e.g. the footer node) to reduce the overall time from CK to Q delay, reduce the capacitive load on CK, increase speed, reduce power consumption, reduce the number of transistors, and reduce integrated circuit area.

A flip-flop of the present disclosure includes a domino logic flip-flop, where a single footer transistor is used to evaluate all nodes in the domino logic flip-flop to be pre-charged, the single footer includes a footer node; and a pre-charge transistor is connected to the footer node for pre-charging the footer node before an evaluation cycle. In an embodiment of the present disclosure, the flip-flop is an SR flip-flop.

A single footer transistor is used, where the single footer transistor has a footer node that is pre-charged when CK is low. This slows down the evaluation process (e.g. widens the setup window), reduces the overall CK to Q delay, and reduces the capacitive load on CK. The speed of the flip-flop is enhanced by sharing the clock footer and pre-charging it before the evaluation cycle.

A flip-flop of the present disclosure requires fewer transistors and occupies a smaller integrated circuit area than does a conventional domino-based SR flip-flop. In addition, a flip-flop of the present disclosure exhibits a reduced CK to Q delay and a higher possible clock frequency than does a conventional high speed flip-flop.

Furthermore, a flip-flop of the present disclosure consumes less power than does a pulsed domino SR flip-flop.

FIG. 1 is a schematic diagram of a flip-flop 100 according to an embodiment of the present disclosure.

Referring to FIG. 1, the flip-flop 100 includes a first transistor 101, including a first terminal connected to a power supply voltage (VDD), a second terminal for receiving a clock signal (CK), and a third terminal. The flip-flop 100 is pre-charged (e.g. the latches of an SR flip-flop are pre-charged) when CK is low and evaluates the pre-charged nodes according to the input values when CK is high. This provides the flip-flop 100 with a negative setup time. That is, an input may be received and become stable after CK transitions to a logic level to change the output of the flip-flop 100. In an embodiment of the present disclosure, the evaluation process is slowed down to reduce the setup time even more and, thus, increase the operating frequency of the flip-flop 100.

A second transistor 103 includes a first terminal connected to VDD, a second terminal for receiving an internal signal, data, and a third terminal for outputting an internal signal $\overline{\text{data}}$.

A third transistor 105 includes a first terminal connected to the third terminal of the first transistor 101, a second terminal for receiving a selection signal (SE), and a third terminal.

A fourth transistor 107 includes a first terminal connected to the third terminal of the second transistor 103, a second terminal for receiving an external data input (D), and a third terminal connected to the third terminal of the third transistor 105.

A fifth transistor 109 includes a first terminal connected to the third terminal of the third transistor 105, a second terminal connected to data at the second terminal of the second transistor 103, and a third terminal.

A sixth transistor 111 includes a first terminal connected to the third terminal of the first transistor 101, a second terminal, and a third terminal connected to the third terminal of the fifth transistor 109.

A first inverter 113 includes an input connected to the third terminal of the first transistor 101, and an output connected to the second terminal of the sixth transistor 111.

A seventh transistor 115 includes a first terminal connected to VDD, a second terminal for receiving the clock signal (CK), and a third terminal connected to the second terminal of the second transistor 103.

An eighth transistor 117 includes a first terminal connected to VDD, a second terminal connected to data at the third terminal of the second transistor 103, and a third terminal connected to the third terminal of the seventh transistor 115.

A ninth transistor 119 includes a first terminal connected to the third terminal of the seventh transistor 115, a second terminal connected to the third terminal of the first transistor 101, and a third terminal.

A tenth transistor 121 includes a first terminal connected to the third terminal of the ninth transistor 119, a second terminal, and a third terminal connected to the third terminal of the fifth transistor 109.

A logic gate 123 includes a first input connected to D at the second terminal of the fourth transistor 107, a second input connected to SE at the second terminal of the third transistor 105, and an output connected to the second terminal of the tenth transistor 121.

An eleventh transistor 125 includes a first terminal connected to the third terminal of the eighth transistor 117, a second terminal, and a third terminal connected to the third terminal of the tenth transistor 121.

A second inverter 127 includes an input connected to the third terminal of the seventh transistor 115, and an output connected to the second terminal of the eleventh transistor 125.

A twelfth transistor 129 includes a first terminal connected to VDD, a second terminal connected to the third terminal of the second transistor 103, and a third terminal.

A thirteenth transistor 131 includes a first terminal connected to the third terminal of the twelfth transistor 129, a second terminal connected to CK at the second terminal of the first transistor 101, and a third terminal.

A fourteenth transistor 133 includes a first terminal connected to the third terminal of the thirteenth transistor 131, a second terminal connected to the second terminal of the twelfth transistor 129, and a third terminal connected to a ground.

A fifteenth transistor 135 includes a first terminal connected to VDD, a second terminal, and a third terminal.

A sixteenth transistor 137 includes a first terminal connected to the third terminal of the fifteenth transistor 135, a second terminal connected to the second terminal of the first transistor 101, and a third terminal that produces a first output q (e.g. Q) of the flip-flop 100.

A seventeenth transistor 139 includes a first terminal connected to the first output q at the third terminal of the sixteenth transistor 137, a second terminal connected to the second terminal of the fifteenth transistor 135, and a third terminal connected to the third terminal of the thirteenth transistor 131.

A third inverter 141 includes an input connected to the third terminal of the twelfth transistor 129, and an output connected to the second terminal of the fifteenth transistor 135.

A fourth inverter 143 includes an input connected to the third terminal of the sixteenth transistor 137, and an output that produces a second output QN of the flip-flop 100.

The pre-charge transistor 145 includes a first terminal connected to VDD, a second terminal connected to CK at the second terminal of the first transistor 101, and a third terminal connected to the third terminal of the fifth transistor 109.

The single footer transistor 147 includes a first terminal connected to the third terminal of the pre-charge transistor 145, a second terminal connected to CK at the second terminal of the pre-charge transistor 145, and a third terminal connected to ground. The first terminal of the single footer transistor 147 generates CKB.

In an embodiment of the present disclosure, the first transistor 101, the second transistor 103, the seventh transistor 115, the eighth transistor 117, the twelfth transistor 129, the fifteenth transistor 135, the sixteenth transistor 137, and the pre-charge transistor 145 are each a p-channel metal oxide semiconductor (PMOS) transistor.

In an embodiment of the present disclosure, the third transistor 105, the fourth transistor 107, the fifth transistor 109, the sixth transistor 111, the ninth transistor 119, the tenth transistor 121, the eleventh transistor 125, the thirteenth transistor 131, the fourteenth transistor 133, the seventeenth transistor 139, and the single footer transistor 147 are each an n-channel metal oxide semiconductor (NMOS) transistor.

In an embodiment of the present disclosure, the first and third terminal of each PMOS transistor is either a source terminal or a drain terminal, and the second terminal of each PMOS transistor is a gate terminal.

In an embodiment of the present disclosure, the first and third terminal of each NMOS transistor is either a source terminal or a drain terminal, and the second terminal of each NMOS transistor is a gate terminal.

In an embodiment of the present disclosure, the logic gate 123 is a NOR gate. However, the logic gate is not limited to a NOR gate. Other logic gates or combinations of logic gates may be used for the logic gate 123.

In an embodiment of the present disclosure, a complimentary signal of a flip-flop may be evaluated in conjunction with other circuit events. By doing so, the speed of a flip-flop is increased and power consumption is reduced by evaluating the complimentary signal in conjunction with other circuit events.

In addition, the operation of the flip-flop is increased while power consumption is reduced, as compared to conventional flip-flops.

The conventional domino-based flip-flop pre-charges the latches of the flip-flop and evaluates the latches when the clock is high. The SR latch or complimentary cascade logic requires complimentary evaluation.

An SR flip-flop uses a complimentary data signal ($\overline{\text{data}}$) to re-set the SR flip-flop, which requires an evaluation of the complimentary data signal. It takes time to generate a compliment of a signal (e.g. a propagation time of an inverter to generate a compliment of a signal input to the inverter). In addition, power is consumed in generating and evaluating the complimentary signal, the consequence of which is a longer evaluation time, which increases the CK to Q delay, and higher power consumption.

In an embodiment of the present disclosure, an apparatus for a flip-flop includes a domino logic flip-flop; and combinatory logic configured to evaluate a complimentary signal in conjunction with circuit events.

In an embodiment of the present disclosure, the flip-flop is an SR flip-flop.

Figure 2:
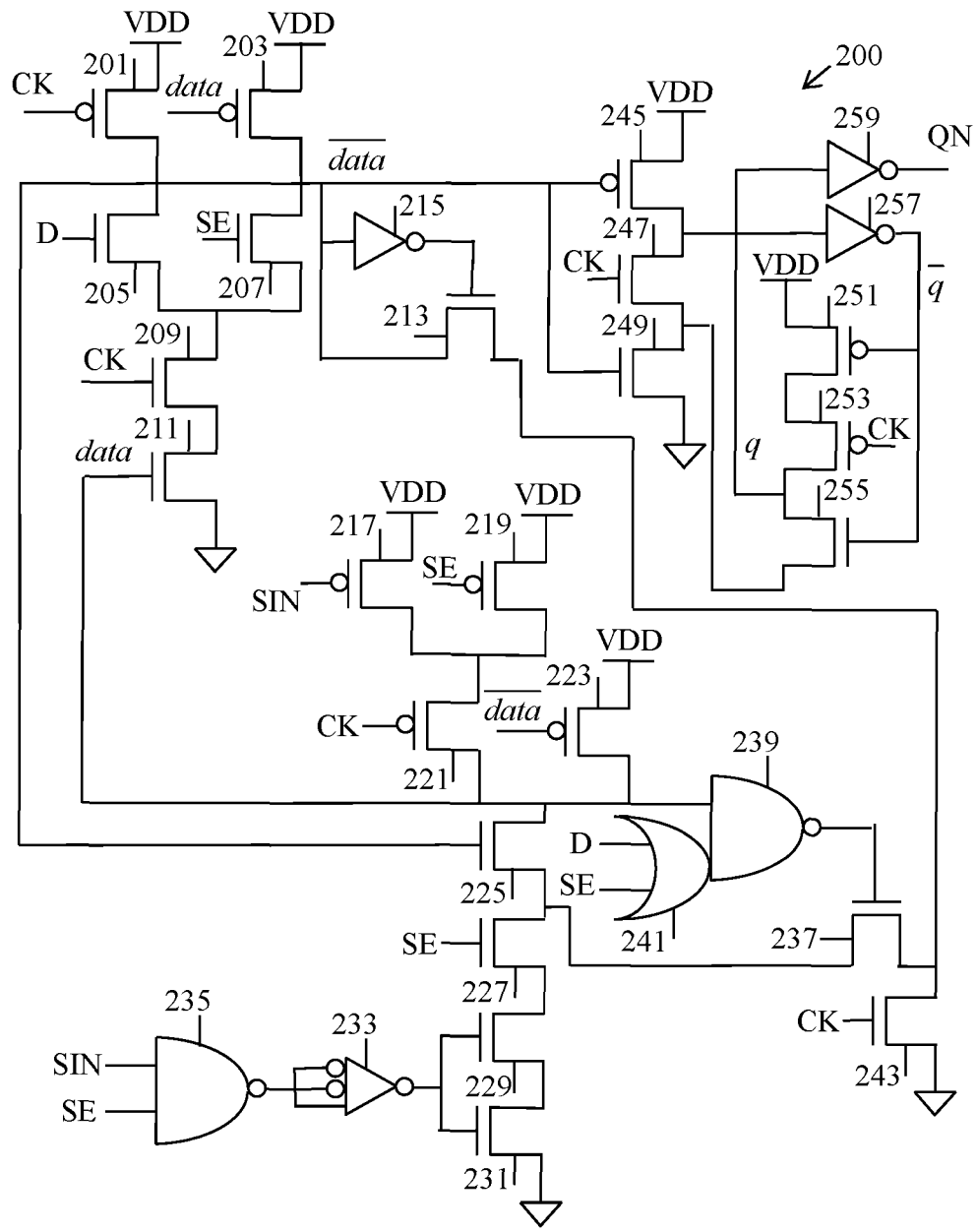
FIG. 2 is a schematic diagram of a flip-flop according to an embodiment of the present disclosure.

FIG. 2 is a schematic diagram of a flip-flop 200 according to an embodiment of the present disclosure.

Referring to FIG. 2, a domino logic flip-flop 200 includes a first transistor 201. The first transistor 201 includes a first terminal connected to VDD, a second terminal for receiving a clock signal (CK), and a third terminal.

A second transistor 203 includes a first terminal connected to VDD, a second terminal for receiving an internal signal, data, and a third terminal for outputting an internal signal $\overline{\text{data}}$.

A third transistor 205 includes a first terminal connected to the third terminal of the first transistor 201, a second terminal for receiving an external data input (D), and a third terminal.

A fourth transistor 207 includes a first terminal connected to the third terminal of the second transistor 203, a second terminal for receiving an external selection signal (SE), and a third terminal connected to the third terminal of the third transistor 205.

A fifth transistor 209 includes a first terminal connected to the third terminal of the third transistor 205, a second terminal connected to CK at the second terminal of the first transistor 201, and a third terminal.

A sixth transistor 211 includes a first terminal connected to the third terminal of the fifth transistor 209, a second terminal connected to data at the second terminal of the second transistor 203, and a third terminal connected to ground.

A seventh transistor 213 includes a first terminal connected to $\overline{\text{data}}$ at the third terminal of the first transistor 201, a second terminal, and a third terminal.

A first inverter 215 includes an input connected to $\overline{\text{data}}$ at the third terminal of the first transistor 201, and an output connected to the second terminal of the seventh transistor 213.

An eighth transistor 217 includes a first terminal connected to VDD, a second terminal for receiving a logic input signal (SIN), and a third terminal.

A ninth transistor 219 includes a first terminal connected to VDD, a second terminal connected to SE at the second terminal of the fourth transistor 207, and a third terminal connected to the third terminal of the eighth transistor 217.

A tenth transistor 221 includes a first terminal connected to the third terminal of the eighth transistor 217, a second terminal connected to CK at the second terminal of the first transistor 201, and a third terminal connected to data at the second terminal of the sixth transistor 211.

An eleventh transistor 223 includes a first terminal connected to VDD, a second terminal connected to the third terminal of the second transistor 203, and a third terminal connected to the third terminal of the tenth transistor 221.

A twelfth transistor 225 includes a first terminal connected to data at the third terminal of the tenth transistor 221, a second terminal connected to $\overline{\text{data}}$ at the third terminal of the first transistor 201, and a third terminal.

A thirteenth transistor 227 includes a first terminal connected to the third terminal of the twelfth transistor 225, a second terminal connected to SE at the second terminal of the fourth transistor 207, and a third terminal.

A fourteenth transistor 229 includes a first terminal connected to the third terminal of the thirteenth transistor 227, a second terminal, and a third terminal.

A fifteenth transistor 231 includes a first terminal connected to the third terminal of the fourteenth transistor 229, a second terminal connected to the second terminal of the fourteenth transistor 229, and a third terminal connected to ground.

A second inverter 233 includes a first inverting input, a second inverting input connected to the first inverted input, a third non-inverting input connected to the first inverting input, and an output connected to the second terminal of the fourteenth transistor 229.

A first logic gate 235 includes a first input connected to SIN at the second terminal of the eighth transistor 217, a second input connected to SE at the second terminal of the fourth transistor 207, and an output connected to the first input of the second inverter 233.

A sixteenth transistor 237 includes a first terminal connected to the third terminal of the twelfth transistor 225, a second terminal, and a third terminal connected to the third terminal of the seventh transistor 213.

A second logic gate 239 includes a first input connected to data at the third terminal of the eleventh transistor 223, a second input, and an output connected to the second terminal of the sixteenth transistor 237.

A third logic gate 241 includes a first input connected to D at the second terminal of the third transistor 205, a second input connected to SE at the second terminal of the fourth transistor 207, and an output connected to the second input of the second logic gate 239.

A seventeenth transistor 243 includes a first terminal connected to the third terminal of the sixteenth transistor 237, a second terminal connected to CK at the second terminal of the first transistor 201, and a third terminal connected to ground.

An eighteenth transistor 245 includes a first terminal connected to VDD, a second terminal connected to $\overline{\text{data}}$ at the third terminal of the second transistor 203, and a third terminal.

A nineteenth transistor 247 includes a first terminal connected to the third terminal of the eighteenth transistor 245, a second terminal connected to CK at the second terminal of the first transistor 201, and a third terminal.

A twentieth transistor 249 includes a first terminal connected to the third terminal of the nineteenth transistor 247, a second terminal connected to $\overline{\text{data}}$ at the second terminal of the eighteenth transistor 245, and a third terminal connected to ground.

A twenty-first transistor 251 includes a first terminal connected to VDD, a second terminal, and a third terminal.

A twenty-second transistor 253 includes a first terminal connected to the third terminal of the twenty-first transistor 251, a second terminal connected to CK at the second terminal of the first transistor 201, and a third terminal that produces a first output q of the flip-flop 200.

A twenty-third transistor 255 includes a first terminal connected to q at the third terminal of the twenty-second transistor 253, a second terminal connected to the second terminal of the twenty-first transistor 251, and a third terminal connected to the third terminal of the nineteenth transistor 247.

A third inverter 257 includes an input connected to the third terminal of the eighteenth transistor 245, and an output connected to the second terminal of the twenty-first transistor 251.

A fourth inverter 259 includes an input connected to the third terminal of the twenty-second transistor 253, and an output that produces a second output QN of the flip-flop 200.

In an embodiment of the present disclosure, the first transistor 201, the second transistor 203, the eighth transistor 217, the ninth transistor 219, the tenth transistor 221, the eleventh transistor 223, the eighteenth transistor 245, the twenty-first transistor 251, and the twenty-second transistor 253 are each a p-channel metal oxide semiconductor (PMOS) transistor.

In an embodiment of the present disclosure, the third transistor 205, the fourth transistor 207, the fifth transistor 209, the sixth transistor 211, the seventh transistor 213, the twelfth transistor 225, the thirteenth transistor 227, the fourteenth transistor 229, the fifteenth transistor 231, the sixteenth transistor 237, the seventeenth transistor 243, the nineteenth transistor 247, the twentieth transistor 249, and the twenty-third transistor 255 are each an n-channel metal oxide semiconductor (NMOS) transistor.

In an embodiment of the present disclosure, the first and third terminal of each PMOS transistor is either a source terminal or a drain terminal, and the second terminal of each PMOS transistor is a gate terminal.

In an embodiment of the present disclosure, the first and third terminal of each NMOS transistor is either a source terminal or a drain terminal, and wherein the second terminal of each NMOS transistor is a gate terminal.

In an embodiment of the present disclosure, the first logic gate 235 is a NAND gate.

In an embodiment of the present disclosure, the second logic gate 239 is a NAND gate.

In an embodiment of the present disclosure, the third logic gate 241 is an OR gate.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An apparatus for a flip-flop, comprising:
a domino logic flip-flop, including a single footer transistor for a plurality of nodes in the domino logic flip-flop to be pre-charged, wherein the single footer transistor includes a footer node, a gate for receiving a clock signal (CK), a drain connected to one of the plurality of nodes in the domino logic flip-flop to be pre-charged, and a source connected directly to a ground, wherein each of the plurality of nodes in the domino logic flip-flop to be pre-charged is connected to a drain of one of a plurality of p-channel metal oxide semiconductor (PMOS) transistors, wherein each of the plurality of PMOS transistors includes a source connected to a power supply voltage and a gate receiving the CK signal; and
a pre-charge transistor including a drain directly connected to the footer node and a source directly connected to the power supply voltage for pre-charging the footer node before an evaluation cycle, wherein the single footer transistor is only one footer transistor, and wherein the one footer transistor is configured to evaluate all of the plurality of nodes in the domino logic flip-flop that are pre-charged.

2. The apparatus of claim 1, wherein the flip-flop is a set-reset (SR) flip-flop.

3. An apparatus for a flip-flop, comprising:
a domino logic flip-flop, including a single footer transistor for a plurality of nodes in the domino logic flip-flop to be pre-charged, wherein the single footer transistor includes a footer node, a gate for receiving a clock signal (CK), and a source connected to a ground; and
a pre-charge transistor directly connected to the footer node for pre-charging the footer node before an evaluation cycle, wherein the domino logic flip-flop is comprised of:
a first transistor, including a first terminal connected to a power supply voltage (VDD), a second terminal for receiving the CK, and a third terminal;
a second transistor, including a first terminal connected to VDD, a second terminal for receiving an internal signal data, and a third terminal for outputting an internal signal $\overline{data}$;
a third transistor, including a first terminal connected to the third terminal of the first transistor, a second terminal for receiving a selection signal (SE), and a third terminal;
a fourth transistor, including a first terminal connected to the third terminal of the second transistor, a second terminal for receiving an external data input (D), and a third terminal connected to the third terminal of the third transistor;
a fifth transistor, including a first terminal connected to the third terminal of the third transistor, a second terminal connected to the second terminal of the second transistor, and a third terminal;
a sixth transistor, including a first terminal connected to the third terminal of the first transistor, a second terminal, and a third terminal connected to the third terminal of the fifth transistor;
a first inverter, including an input connected to the third terminal of the first transistor, and an output connected to the second terminal of the sixth transistor;
a seventh transistor, including a first terminal connected to VDD, a second terminal for receiving the CK, and a third terminal connected to the second terminal of the second transistor;
an eighth transistor, including a first terminal connected to VDD, a second terminal connected to the third terminal of the second transistor, and a third terminal connected to the third terminal of the seventh transistor;
a ninth transistor, including a first terminal connected to the third terminal of the seventh transistor, a second terminal connected to the third terminal of the first transistor, and a third terminal;
a tenth transistor, including a first terminal connected to the third terminal of the ninth transistor, a second terminal, and a third terminal connected to the third terminal of the fifth transistor;
a logic gate, including a first input connected to the second terminal of the fourth transistor, a second input connected to the second terminal of the third transistor, and an output connected to the second terminal of the tenth transistor;
an eleventh transistor, including a first terminal connected to the third terminal of the eighth transistor, a second terminal, and a third terminal connected to the third terminal of the tenth transistor;
a second inverter, including an input connected to the third terminal of the seventh transistor, and an output connected to the second terminal of the eleventh transistor;
a twelfth transistor, including a first terminal connected to VDD, a second terminal connected to the third terminal of the second transistor, and a third terminal;
a thirteenth transistor, including a first terminal connected to the third terminal of the twelfth transistor, a second terminal connected to the second terminal of the first transistor, and a third terminal;

a fourteenth transistor, including a first terminal connected to the third terminal of the thirteenth transistor, a second terminal connected to the second terminal of the twelfth transistor, and a third terminal connected to the ground;

a fifteenth transistor, including a first terminal connected to VDD, a second terminal, and a third terminal;

a sixteenth transistor, including a first terminal connected to the third terminal of the fifteenth transistor, a second terminal connected to the second terminal of the first transistor, and a third terminal that produces a first output q of the flip-flop;

a seventeenth transistor, including a first terminal connected to the third terminal of the sixteenth transistor, a second terminal connected to the second terminal of the fifteenth transistor, and a third terminal connected to the third terminal of the thirteenth transistor;

a third inverter, including an input connected to the third terminal of the twelfth transistor, and an output connected to the second terminal of the fifteenth transistor; and a fourth inverter, including an input connected to the third terminal of the sixteenth transistor, and an output that produces a second output QN of the flip-flop.

4. The apparatus of claim 3, wherein the pre-charge transistor includes a first terminal connected to VDD, a second terminal connected to the second terminal of the first transistor, and a third terminal connected to the third terminal of the fifth transistor, and
wherein the single footer transistor includes a first terminal connected to the third terminal of the pre-charge transistor, a second terminal connected to the second terminal of the pre-charge transistor, and a third terminal connected to the ground.

5. The apparatus of claim 4, wherein the first transistor, the second transistor, the seventh transistor, the eighth transistor, the twelfth transistor, the fifteenth transistor, the sixteenth transistor, and the pre-charge transistor are each a p-channel metal oxide semiconductor (PMOS) transistor.

6. The apparatus of claim 5, wherein the first and third terminal of each PMOS transistor is either a source terminal or a drain terminal, and wherein the second terminal of each PMOS transistor is a gate terminal.

7. The apparatus of claim 4, wherein the third transistor, the fourth transistor, the fifth transistor, the sixth transistor, the ninth transistor, the tenth transistor, the eleventh transistor, the thirteenth transistor, the fourteenth transistor, the seventeenth transistor, and the single footer transistor are each an n-channel metal oxide semiconductor (NMOS) transistor.

8. The apparatus of claim 7, wherein the first and third terminal of each NMOS transistor is either a source terminal or a drain terminal, and wherein the second terminal of each NMOS transistor is a gate terminal.

9. The apparatus of claim 3, wherein the logic gate is a NOR gate.

10. A method for a flip-flop, comprising:
including, in a domino logic flip-flop, a single footer transistor for a plurality of nodes in the domino logic flip-flop to be pre-charged, wherein the single footer transistor includes a footer node, a gate for receiving a clock signal (CK), a drain connected to one of the plurality of nodes in the domino logic flip-flop to be pre-charged, and a source connected directly to a ground, wherein each of the plurality of nodes in the domino logic flip-flop to be pre-charged is connected to a drain of one of a plurality of p-channel metal oxide semiconductor (PMOS) transistors, wherein each of the plurality of PMOS transistors includes a source connected to a power supply voltage and a gate receiving the CK signal; and pre-charging, by a pre-charge transistor including a drain directly connected to the footer node and a source directly connected to the power supply voltage, the footer node before an evaluation cycle, wherein the single footer transistor is only one footer transistor, and wherein the one footer transistor is configured to evaluate all of the plurality of nodes in the domino logic flip-flop that are pre-charged.

11. The method of claim 10, wherein the flip-flop is a set-reset (SR) flip-flop.

12. The method of claim 10, wherein the domino logic flip-flop is comprised of:
a first transistor, including a first terminal connected to a power supply voltage (VDD), a second terminal for receiving the CK, and a third terminal;

a second transistor, including a first terminal connected to VDD, a second terminal for receiving an internal signal data, and a third terminal for outputting an internal signal $\overline{\text{data}}$;

a third transistor, including a first terminal connected to the third terminal of the first transistor, a second terminal for receiving a selection signal (SE), and a third terminal;

a fourth transistor, including a first terminal connected to the third terminal of the second transistor, a second terminal for receiving an external data input (D), and a third terminal connected to the third terminal of the third transistor;

a fifth transistor, including a first terminal connected to the third terminal of the third transistor, a second terminal connected to the second terminal of the second transistor, and a third terminal;

a sixth transistor, including a first terminal connected to the third terminal of the first transistor, a second terminal, and a third terminal connected to the third terminal of the fifth transistor;

a first inverter, including an input connected to the third terminal of the first transistor, and an output connected to the second terminal of the sixth transistor;

a seventh transistor, including a first terminal connected to VDD, a second terminal for receiving the CK, and a third terminal connected to the second terminal of the second transistor;

an eighth transistor, including a first terminal connected to VDD, a second terminal connected to the third terminal of the second transistor, and a third terminal connected to the third terminal of the seventh transistor;

a ninth transistor, including a first terminal connected to the third terminal of the seventh transistor, a second terminal connected to the third terminal of the first transistor, and a third terminal;

a tenth transistor, including a first terminal connected to the third terminal of the ninth transistor, a second terminal, and a third terminal connected to the third terminal of the fifth transistor;

a logic gate, including a first input connected to the second terminal of the fourth transistor, a second input connected to the second terminal of the third transistor, and an output connected to the second terminal of the tenth transistor;

an eleventh transistor, including a first terminal connected to the third terminal of the eighth transistor, a second terminal, and a third terminal connected to the third terminal of the tenth transistor;

a second inverter, including an input connected to the third terminal of the seventh transistor, and an output connected to the second terminal of the eleventh transistor;

a twelfth transistor, including a first terminal connected to VDD, a second terminal connected to the third terminal of the second transistor, and a third terminal;

a thirteenth transistor, including a first terminal connected to the third terminal of the twelfth transistor, a second terminal connected to the second terminal of the first transistor, and a third terminal;

a fourteenth transistor, including a first terminal connected to the third terminal of the thirteenth transistor, a second terminal connected to the second terminal of the twelfth transistor, and a third terminal connected to the ground;

a fifteenth transistor, including a first terminal connected to VDD, a second terminal, and a third terminal;

a sixteenth transistor, including a first terminal connected to the third terminal of the fifteenth transistor, a second terminal connected to the second terminal of the first transistor, and a third terminal that produces a first output q of the flip-flop;

a seventeenth transistor, including a first terminal connected to the third terminal of the sixteenth transistor, a second terminal connected to the second terminal of the fifteenth transistor, and a third terminal connected to the third terminal of the thirteenth transistor;

a third inverter, including an input connected to the third terminal of the twelfth transistor, and an output connected to the second terminal of the fifteenth transistor; and a fourth inverter, including an input connected to the third terminal of the sixteenth transistor, and an output that produces a second output QN of the flip-flop.

13. The method of claim 12, wherein the pre-charge transistor includes a first terminal connected to VDD, a second terminal connected to the second terminal of the first transistor, and a third terminal connected to the third terminal of the fifth transistor, and wherein the single footer transistor includes a first terminal connected to the third terminal of the pre-charge transistor, a second terminal connected to the second terminal of the pre-charge transistor, and a third terminal connected to the ground.

14. The method of claim 13, wherein the first transistor, the second transistor, the seventh transistor, the eighth transistor, the twelfth transistor, the fifteenth transistor, the sixteenth transistor, and the pre-charge transistor are each a p-channel metal oxide semiconductor (PMOS) transistor.

15. The method of claim 13, wherein the third transistor, the fourth transistor, the fifth transistor, the sixth transistor, the ninth transistor, the tenth transistor, the eleventh transistor, the thirteenth transistor, the fourteenth transistor, the seventeenth transistor, and the single footer transistor are each an n-channel metal oxide semiconductor (NMOS) transistor.

16. The method of claim 14, wherein the first and third terminal of each PMOS transistor is either a source terminal or a drain terminal, and wherein the second terminal of each PMOS transistor is a gate terminal.

17. The method of claim 15, wherein the first and third terminal of each NMOS transistor is either a source terminal or a drain terminal, and wherein the second terminal of each NMOS transistor is a gate terminal.

18. The method of claim 12, wherein the logic gate is a NOR gate.

19. The apparatus of claim 1, wherein the footer node is configured to generate a clock signal CKB that is an inverse of the CK signal.

20. The apparatus of claim 1, wherein the pre-charge transistor includes a gate for receiving the CK signal.

* * * * *